(12) United States Patent
Hynecek

(10) Patent No.: US 6,459,077 B1
(45) Date of Patent: Oct. 1, 2002

(54) BUCKET BRIGADE TDI PHOTODIODE SENSOR

(75) Inventor: Jaroslav Hynecek, Richardson, TX (US)

(73) Assignee: Dalsa, Inc., Waterloo (CA)

( * ) Notice: Subject to any disclaimer, the term of this patent is extended or adjusted under 35 U.S.C. 154(b) by 0 days.

(21) Appl. No.: 09/395,994

(22) Filed: Sep. 15, 1999

Related U.S. Application Data
(60) Provisional application No. 60/100,410, filed on Sep. 15, 1998.

(51) Int. Cl.$^7$ .................................................. H04N 3/14
(52) U.S. Cl. ............................. 250/208.1; 250/214.1; 257/251; 348/295; 377/57
(58) Field of Search .......................... 250/208.1, 214 R, 250/214.1; 257/225, 226, 229, 231, 232, 233, 251, 290, 291; 348/295, 297, 298, 303, 317; 377/57

(56) References Cited

U.S. PATENT DOCUMENTS

| | | | |
|---|---|---|---|
| 3,683,193 A | 8/1972 | Weimer | |
| 3,811,055 A | 5/1974 | Weimer | |
| 3,856,989 A * | 12/1974 | Weimer | .................. 250/214.1 |
| 4,001,878 A * | 1/1977 | Weimer | ....................... 348/280 |
| 4,117,514 A | 9/1978 | Terui et al. | |
| 4,264,930 A * | 4/1981 | White | ......................... 348/295 |
| 4,405,857 A | 9/1983 | Hirai et al. | |
| 4,479,201 A * | 10/1984 | Domingo | ..................... 257/240 |
| 4,779,124 A | 10/1988 | Hynecek | |
| 5,315,114 A | 5/1994 | Kansy et al. | |
| 5,323,186 A | 6/1994 | Chow | |
| 6,215,139 B1 * | 4/2001 | Iida et al. | .................... 257/291 |

* cited by examiner

Primary Examiner—Kevin Pyo
(74) Attorney, Agent, or Firm—Dorsey & Whitney LLP (57) ABSTRACT

A TDI sensor includes a bias charge voltage circuit, a reset voltage circuit, a bucket brigade column having a plurality of nodes, and a plurality of pinned photodiodes. Each photodiode is formed integral with a corresponding node of the bucket brigade column. The bucket brigade column is coupled between the bias charge voltage circuit at an initial node and the reset voltage circuit at a final node. The bucket brigade column includes a plurality of first phase clock conductors, and a plurality of second phase clock conductors, and the first and second phase clock conductors are interdigitated and formed of poly-crystalline silicon. The TDI sensor is formed in a substrate of a first conductivity type, and a cathode of each pinned photodiode is formed of a second conductivity type, and each pinned photodiode includes a pinning layer of the first conductivity type.

24 Claims, 6 Drawing Sheets

BUCKET BRIGADE TDI PHOTODIODE SENSOR

The priority benefit of the Sep. 15, 1998 filing date of provisional application serial No. 60/100,410 is hereby claimed.

BACKGROUND OF THE INVENTION

1. Field of the Invention

The present invention relates to TDI photodiode sensor. In particular, the invention relates to use of a bucket brigade architecture for the TDI sensor to achieve CMOS process compatible TDI sensor.

2. Description Of Related Art

Today's Time Delay and Integrate (TDI) sensors are implemented in Charge Coupled Device (CCD) technology. CCDs provide high charge transfer efficiency (CTE). However, CCD fabrication requires many steps and tight controls on the processes, and in general, it is more expensive than other technologies, such as bucket brigade charge transfer devices. Bucket brigade devices are NMOS devices that can be fabricated using standard CMOS processes. However, without efficient charge transfer, it is not possible to design and fabricate advanced TDI sensors. Known bucket brigade devices suffer from poor charge transfer efficiency relative to the efficiency needed in modern TDI sensors.

Figure 1:
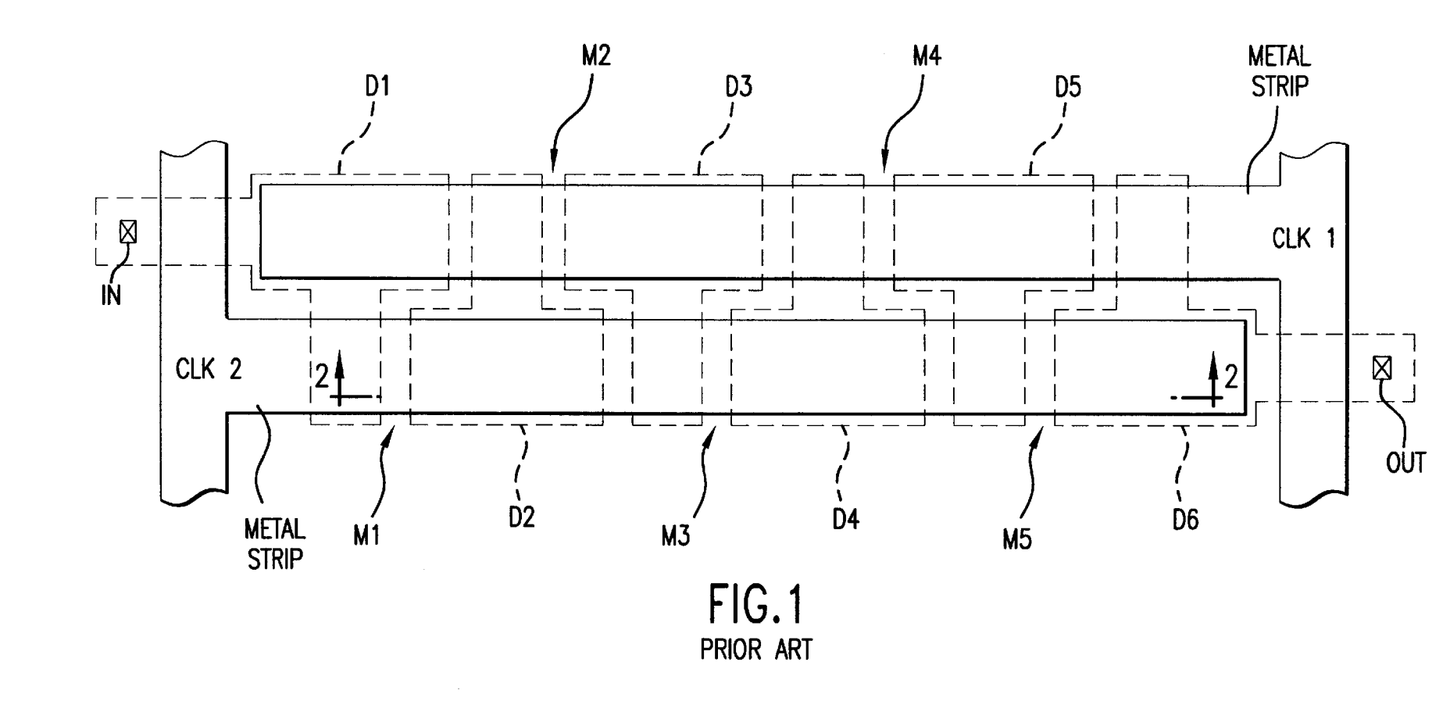
FIG. 1 is a plan view of a known bucket brigade sensor column with metal straps.

Bucket brigade charge transfer devices have been known since the 1970s. In U.S. Pat. No. 3,683,193 to Weimer, filed Oct. 26, 1970, incorporated herein by reference, a bucket brigade charge transfer device used as a frame transfer device has been integrated with an array of photodiodes to achieve a bucket brigade sensor. In FIG. 1, plural n type diffusions (D1 through D6) are formed in a p type substrate, each diffusion having the shape of the letter "T". An insulator film is formed over the entire substrate so as to have thick and thin regions as described below. Plural metal straps are formed over the insulator film so as to overlay the diffusions at alternating large and small areas, short channels being disposed beneath a metal strap and between adjacent large and small areas.

Figure 2:
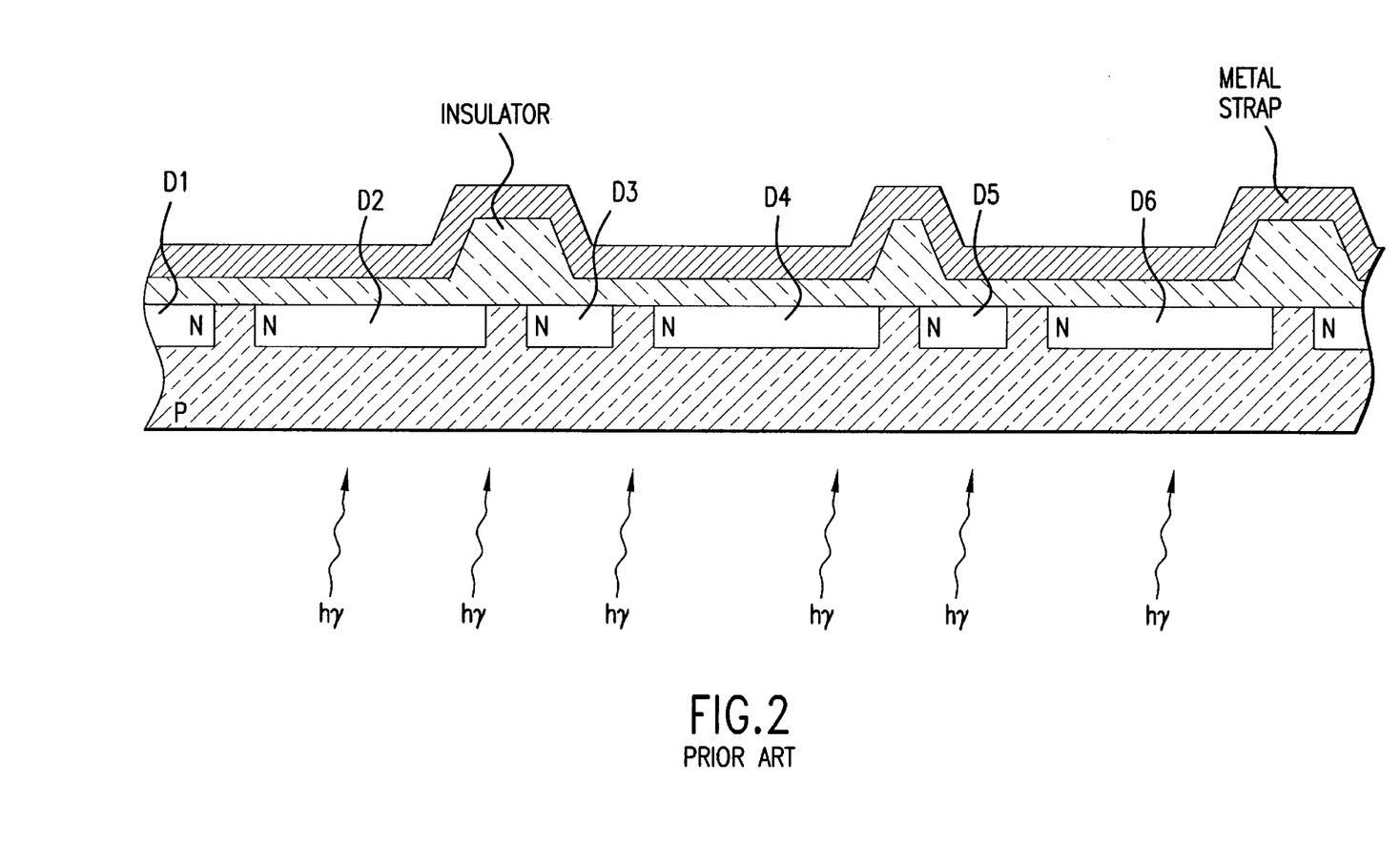
FIG. 2 is a section view of a known bucket brigade sensor with metal straps.

In FIG. 2 (a sectional view longitudinally through the metal strap that carries CLK 2), the channel between diffusions D2 and D3 is covered by a thick insulator, and the channel between diffusions D4 and D5 is covered by a thick insulator. The thick insulator diminishes the electric field in the underlying channel so that the channel does not conduct charge even when a positive clock signal (e.g.,+5 to +15 volts) is applied to the metal strap. In contrast, the channel between diffusions D3 and D4 is covered by a thin insulator, and the channel between diffusions D5 and D6 is covered by a thin insulator so that the channel conducts charge when a positive clock signal (e.g.,+5 to +15 volts) is applied to the metal strap. In this way, the bucket brigade device becomes a one way device transferring charge from input IN to output OUT (FIG. 1).

Each large area forms a large capacitance between the metal strap and the underlying diffusion. Each small area forms a relatively smaller capacitance between the metal strap and the underlying diffusion. When a positive clock signal (e.g.,+5 to +15 volts) is applied to a metal strap, the channels under the metal strap (where the insulator film is thin) become conductive (i.e., forms a surface channel MOS type transistor in an "on" state between the two adjacent diffusions). The source is characterized by a capacitance between the source and the metal strap. The drain is characterized by a capacitance between the drain and the metal strap. All other things being equal, charge will distribute between the source and drain (i.e., the adjacent diffusion regions) in proportion to their respective capacitances. When the clock signal returns to ground and the surface channels between the adjacent diffusions becomes non-conductive, a greater quantity of the total charge will be trapped in the diffusions with the greater capacitance. A greater capacitance difference will provide a greater charge transfer efficiency.

By alternately clocking CLK1 and CLK2 (not overlapping), charge is moved from input IN to output OUT (FIG. 1). Clocking CLK2 will move charge Q from diffusion D1 through MOS transistor M1 into diffusion D2. Then, clocking CLK1 will move charge Q from diffusion D2 through MOS transistor M2 into diffusion D3, but charge Q will not back transfer through the channel under CLK1 from diffusion D2 to diffusion D1 since this channel is covered by a thick insulator. Then, clocking CLK2 again will move charge Q from diffusion D3 through MOS transistor M3 into diffusion D4, but charge Q will not back transfer through the channel under CLK2 from diffusion D3 to diffusion D2 since this channel is covered by a thick insulator.

U.S. Pat. No. 3,683,193 to Weimer also teaches that the diffusion areas form a PN junction with the substrate so as to act as reverse biased photodiodes when this structure is illuminated from the back. When illuminated from the back, the substrate must be thinned (to about 0.5 mils thickness) to a thickness comparable to the diffusion range of photo-carriers. When illuminated from the front (i.e., the metalized side) the substrate may be thicker (e.g., 10 mils or so), but the metal straps must be either narrow or sufficiently thin to be semi-transparent to the illumination.

SUMMARY OF THE INVENTION

It is an object to the present invention to provide a TDI bucket brigade structure that is adapted to standard single poly CMOS processes. It is another object of the present invention to provide a TDI sensor with good blue and UV response. It is a further object of the present invention to provide a TDI sensor low lag time and high charge transfer efficiency.

These and other objects are achieved in a TDI sensor that includes a bias charge voltage circuit, a reset voltage circuit, a bucket brigade column having a plurality of nodes, and a plurality of pinned photodiodes. A cathode of each photodiode is formed integral with a corresponding node of the bucket brigade column. The bucket brigade column is coupled between the bias charge voltage circuit at an initial node and the reset voltage circuit at a final node. The bucket brigade column includes a plurality of first phase clock conductors, and a plurality of second phase clock conductors, and the first and second phase clock conductors are interdigitated and formed of poly-crystalline silicon. The TDI sensor is formed in a substrate of a first conductivity type, and a cathode of each pinned photodiode is formed of a second conductivity type, and each pinned photodiode includes a pinning layer of the first conductivity type.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

CMOS technology offers advantages in sensor applications compared to CCD technologies such as lower power supply voltages, lower power consumption, lower fabrication cost, and a system integration capability with timing and control circuits on the same chip. However, CCD devices (e.g., CCD TDI imaging sensor arrays) are difficult to implement in CMOS technology fabrication lines owing, at least in part, to the many steps and tight controls or different control required in the CCD device processes.

Bucket brigade devices have so far not been widely used for TDI imaging sensor arrays due to the relatively poor charge transfer efficiency. The Weimer sensor, discussed above, is a frame transfer sensor for TV imaging. A TDI sensor requires low production of noise (e.g., dark current) since the noise would be integrated in the TDI operation along with the photo signal.

In the present invention, a pinned photodiode array is coupled to a modern state-of-the-art bucket brigade shift register. A pinned photodiode is an improved diode technology that provides superior conversion of light to charge with improved Quantum Efficiency (QE) without adding any significant amount of dark current. The bucket brigade charge transfer efficiency is improved to be similar to the efficiency expected of typical CCD devices by slowing the scanning rate from that of known area sensors to that rate which is required of a TDI sensor, and by reducing the number of stages required for integration to less than the number of stages normally required in a vertical transfer register of an area sensor (e.g., 512 stages) to that used in a TDI sensor (e.g., 96 stages). The bias voltage generator and the reset voltage generator described herein further improves the charge transfer efficiency by biasing the operation the NMOS transistors in the bucket brigade column to where the greatest transfer efficiency can be obtained to thereby improve the small signal CTE and minimize unwanted effects such as image lag.

Figure 3:
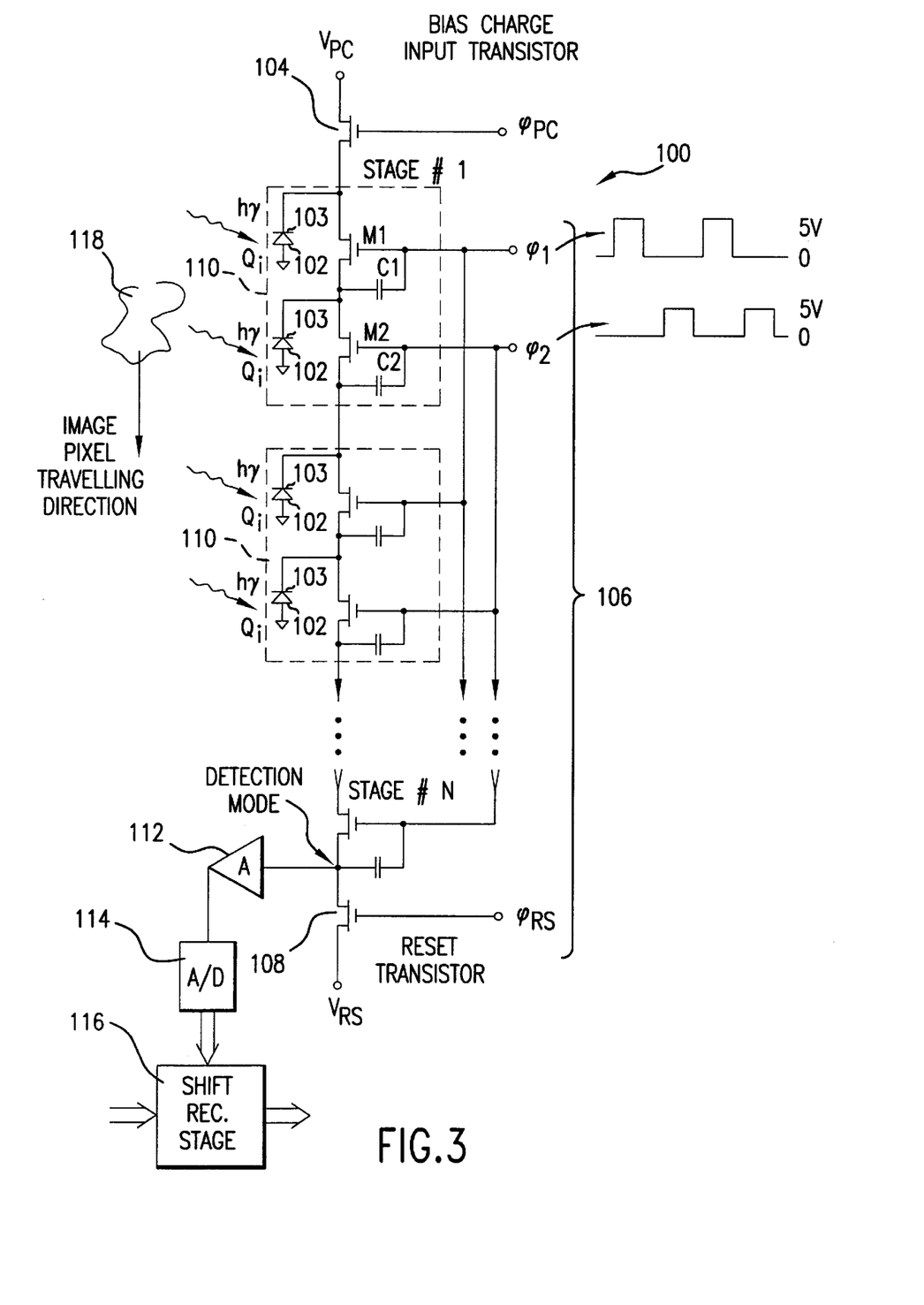
FIG. 3 is a schematic diagram of a bucket brigade TDI sensor column according to the present invention.

In FIG. 3, bucket brigade TDI photodiode sensor column 100 includes bias charge input transistor 104, reset transistor 108, and bucket brigade photo array shift register 106 coupled in series between transistor 104 and transistor 108. Bucket brigade photo array shift register 106 includes a plurality of stage pairs 110 (arrayed in a bucket brigade column). Each stage pair includes first MOS transistor structure M1, first capacitor C1 coupled between a gate and a drain of first MOS transistor structure M1, a first pinned photodiode 102 coupled to a source of first MOS transistor structure M1, second MOS transistor structure M2 with a source integrally formed with the drain of first MOS transistor structure M1, second capacitor C2 coupled between a gate and a drain of second MOS transistor structure M2, and a second pinned photodiode 102 coupled to the source of second MOS transistor structure M2.

The transistors (e.g., M2) obey a square law such that the voltage on the source, $V_S$, will be equal to β (i.e., transistor gain) times the square of the difference between the gate voltage, $V_G$, and the source voltage, $V_S$. Then, the voltage at the source will as a function of time, t, be given by:

$$V_S = V_G \times t \times (t + C/\beta)$$

where C is the capacitance between the clock line and the source.

Figure 4:
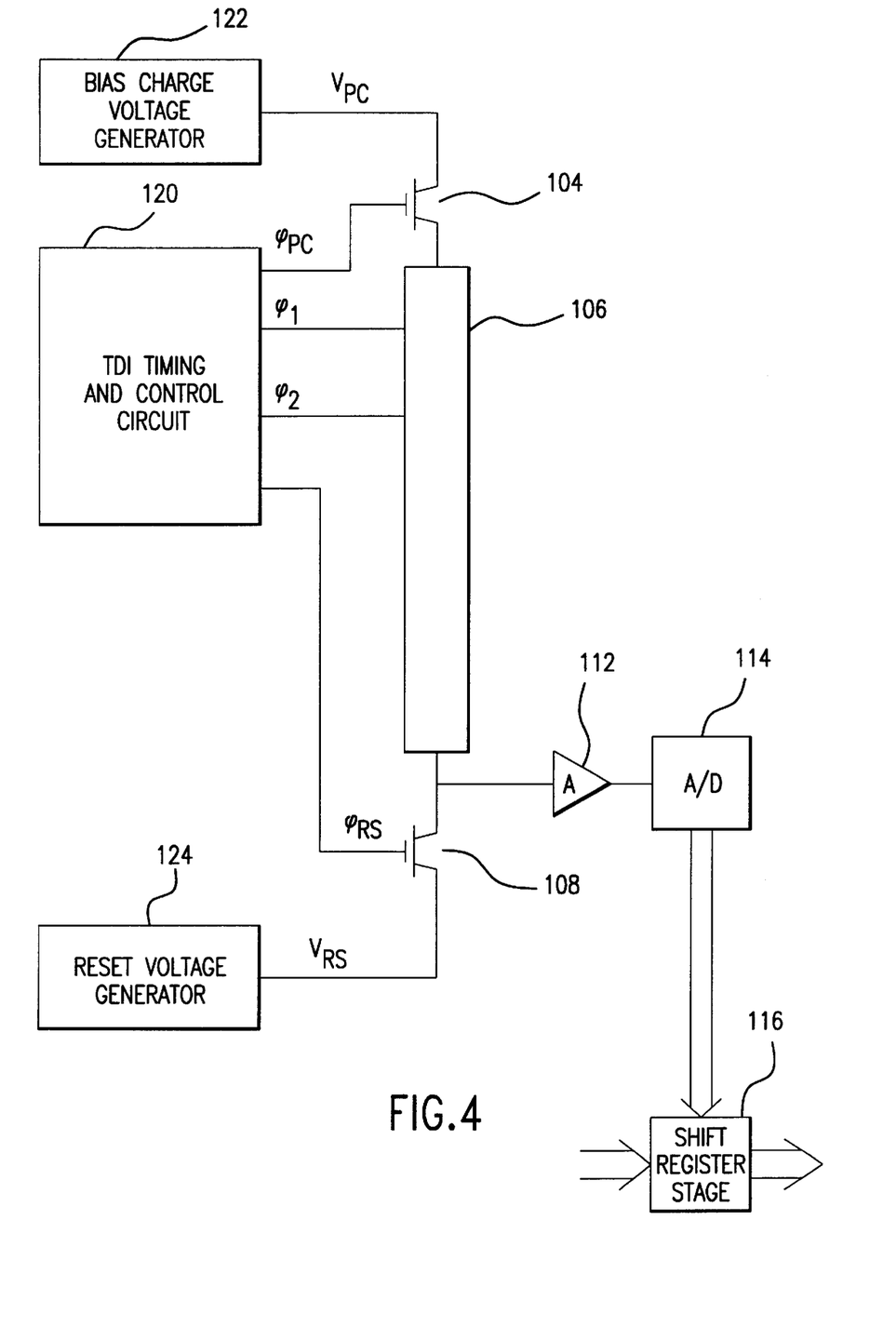
FIG. 4 is a functional block diagram of the bucket brigade TDI sensor according to the present invention.

In FIG. 4, the advantages of a CMOS implementation of the TDI sensor can be more fully appreciated. FIG. 4 depicts a single bucket brigade TDI photodiode sensor column 100 and its control circuitry that includes TDI timing and control circuit 120, bias charge voltage generator 122 and reset voltage generator 124. Bucket brigade TDI photodiode sensor column 100 includes bias charge input transistor 104, bucket brigade photo array shift register 106, reset transistor 108, amplifier 112, A/D converter 114 and shift register stage 116 as depicted in FIGS. 3 and 4. It will be appreciated that plural bucket brigade TDI photodiode sensor columns 100 can be, and in practical implementations are, controlled by one set of TDI timing and control circuit 120, bias charge voltage generator 122 and reset voltage generator 124.

In TDI operation, TDI timing and control circuit 120 generates clock $\phi_1$ and clock $\phi_2$ to be alternating, cyclical and non-overlapping positive pulses (e.g., from a 0 volt low to a 5 volt high and back to a 0 volt low). TDI timing and control circuit 120 also generates clock $\phi_{PC}$ to be synchronous with clock $\phi_2$ and clock $\phi_{RS}$ to be synchronous with clock $\phi_1$. The rate of clocking is dependent on the rate at which image 118 moves along column 100 as described below. When clock $\phi_{PC}$ is high (e.g., 5 volts) pre-charge voltage $V_{PC}$ is coupled to an input of bucket brigade photo array shift register 106 to charge a node to which cathode 103 (FIG. 3) of first photodiode 102 is integrally formed to pre-charge voltage $V_{PC}$. When clock $\phi_{PC}$ is low (e.g., 0 volts) precharge voltage $V_{PC}$ is de-coupled from the input of bucket brigade photo array shift register 106 to allow photo-electrons generated in photodiode 102 to partially discharge the voltage on the node. When clock $\phi_{RS}$ is high (e.g., 5 volts) reset voltage $V_{RS}$ is coupled to an output of bucket brigade photo array shift register 106 to discharge a last node, the Detection Node, to reset voltage $V_{RS}$. When clock $\phi_{RS}$ is low (e.g., 0 volts) reset voltage $V_{RS}$ is de-coupled from the output of bucket brigade photo array shift register 106 to allow amplifier 112 to sense the charge that has accumulated on the Detection Node.

Clock $\phi_1$ and clock $\phi_2$ are alternately and cyclically clocked at a rate sufficient to transfer charge along bucket brigade photo array shift register 106 synchronously with a rate of movement of image 118 (which is an optical conjugate of an object being imaged). In a TDI sensor, image 118 moves either because the object is moving or the sensor is moving. Charge is accumulated in the first photodiode of a first stage pair 110 while a point in image 118 is focused on the first photodiode. Then, bucket brigade photo array shift register 106 is clocked to move the accumulated photo-charge into the drain of the first MOS transistor structure M1 of the first stage pair 110 at the same time as the point in image 118 moves to a second photodiode in the first stage pair 110. The drain of the first MOS transistor structure is integrally formed with the source of the second MOS transistor structure M2 and the second pinned photodiode of the first stage pair 110. Thus, the accumulating charge packet continues to accumulate charge according to the light from the point in image 118.

This cyclic clocking continues until the accumulating charge is transferred to the Detection Node, integrated in each stage according to the charge generated in each pinned photodiode. The voltage on a node at each stage is discharged according to the number of accumulating photoelectrons. Initially, the first node is set to pre-charge voltage $V_{PC}$, which may discharge over the several stages of the TDI column to be reduced by, for example, 2 volts as a design limit. This two volt range of signal is advantageously adjusted to be more positive or more negative so as to center the range in the optimal operating region for transistors M1 and M2 (FIG. 3) by setting bias charge voltage generator 122 to generate a predetermined pre-charge voltage $V_{PC}$ and by setting reset voltage generator 124 to generate a predetermined reset voltage $V_{RS}$.

Pre-charge voltage $V_{PC}$ and reset voltage $V_{RS}$ are provided by respective generator circuits 122 and 124. Generator circuits 122 and 124 may be as little as a wiring connection from respective transistors 104 and 108 to bonding pads on the chip's peripheral so that external supplies can provide the pre-charge voltage $V_{PC}$ and reset voltage $V_{RS}$. Alternatively, generator circuits 122 and 124 are buffer amplifiers (e.g., source follower circuits) to isolate power supply noise from pre-charge voltage $V_{PC}$ and reset voltage $V_{RS}$, or are more complex regulator circuits that maintain pre-charge voltage $V_{PC}$ and reset voltage $V_{RS}$ at desired levels to optimize charge transfer efficiency over a range of sensor fabrication conditions. For example, buffer amplifiers such as source followers provide pre-charge voltage $V_{PC}$ and reset voltage $V_{RS}$ that are set from external references, but such reference voltages are set assuming the transistors of the bucket brigade column have predetermined characteristics. When the sensor is fabricated, the transistors may have slightly different than expected characteristics (e.g., threshold voltages). By using more complex regulator circuits, the voltage levels for pre-charge voltage $V_{PC}$ and reset voltage $V_{RS}$ are set in generator circuits 122 and 124 so as to be self adjusting to compensate for any variation in the characteristics of transistors in the bucket brigade column.

The voltage on the Detection Node is reset to reset voltage $V_{RS}$ by reset transistor 108 before the final accumulated charge is transferred to the Detection Node during clock phase $\phi_2$. Then, the voltage on the Detection Node is sensed by output buffer amplifier 112. Typically amplifier 112 has a first stage source follower as a transconductance amplifier and from 3 to 7 additional transistor amplifier stages after that. The output of amplifier 112 is converted to a digital signal in analog to digital converter 114, and then loaded into output shift register stage 116.

A complete sensor includes plural TDI columns like sensor column 100 as well as the timing and control circuits and output registers and circuits. Because the bucket brigade technology can be fabricated from a process that is compatible CMOS fabrication processes. The entire sensor, including TDI timing and control circuit 120, bias charge voltage generator 122, reset voltage generator 124, amplifier 12 output A/D circuit 114 and output shift register stage 116 can be fabricated on a signal chip.

However, to achieve an operable bucket brigade device that is compatible with CMOS processes, the bucket brigade device must be clocked by voltages compatible with CMOS circuits (typically 0 to 5 volts). The use of metal straps in a bucket brigade structure (e.g., as in the Weimer patent) necessitates use of a relatively thick insulator between the metal straps and the underlying substrate. This metal strap and thick insulator structure requires greater clock voltages (e.g., 12 volts to 15 volts), compared to normal CMOS voltages, to induce surface channel conduction in the transistors of the bucket brigade structure. Normal CMOS circuits operate with voltages that range from 0 volts to 5 volts.

To address this incompatibility issue, the present invention replaces the metal straps used by Weimer with doped poly-crystalline silicon conductive straps (i.e., poly straps). Processes that use poly straps permit the use of thinner insulation layers, compared to metal straps, so that the clock voltages required to induce surface channel conduction in the transistors of the bucket brigade structure are compatible with normal CMOS circuits (e.g., 0 to 5 volts).

To achieve good blue and UV response, there must be a means to get photo-electrons generated by the blue and UV light into the nodes (i.e., the sources/drains) of the bucket brigade structure. Blue and UV light interact with silicon to generate photo-electrons for the most part in only the surface layer. A back surface illuminated sensor as described by Weimer will not put the photo-electrons from UV light into the bucket brigade nodes without additional measures such a forming a special electric field to induce charge drift into the nodes. Thin "semi-transparent" metal straps used in a front surface illuminated sensor as described by Weimer will be mostly opaque to UV light.

Narrow metal straps that expand the silicon area uncovered by metal to expose an underlying PN photodiode as described by Weimer will permit UV light illuminated on the front surface of the sensor to reach the photodiode. However, this is an unsatisfactory solution for a TDI sensor. The many stages of a modern TDI sensor would require long runs of the narrow metal straps with high electrical resistance, and this structure would put limits on current carrying capacity of the straps, and therefore the clock speed of the sensor.

Figure 6:
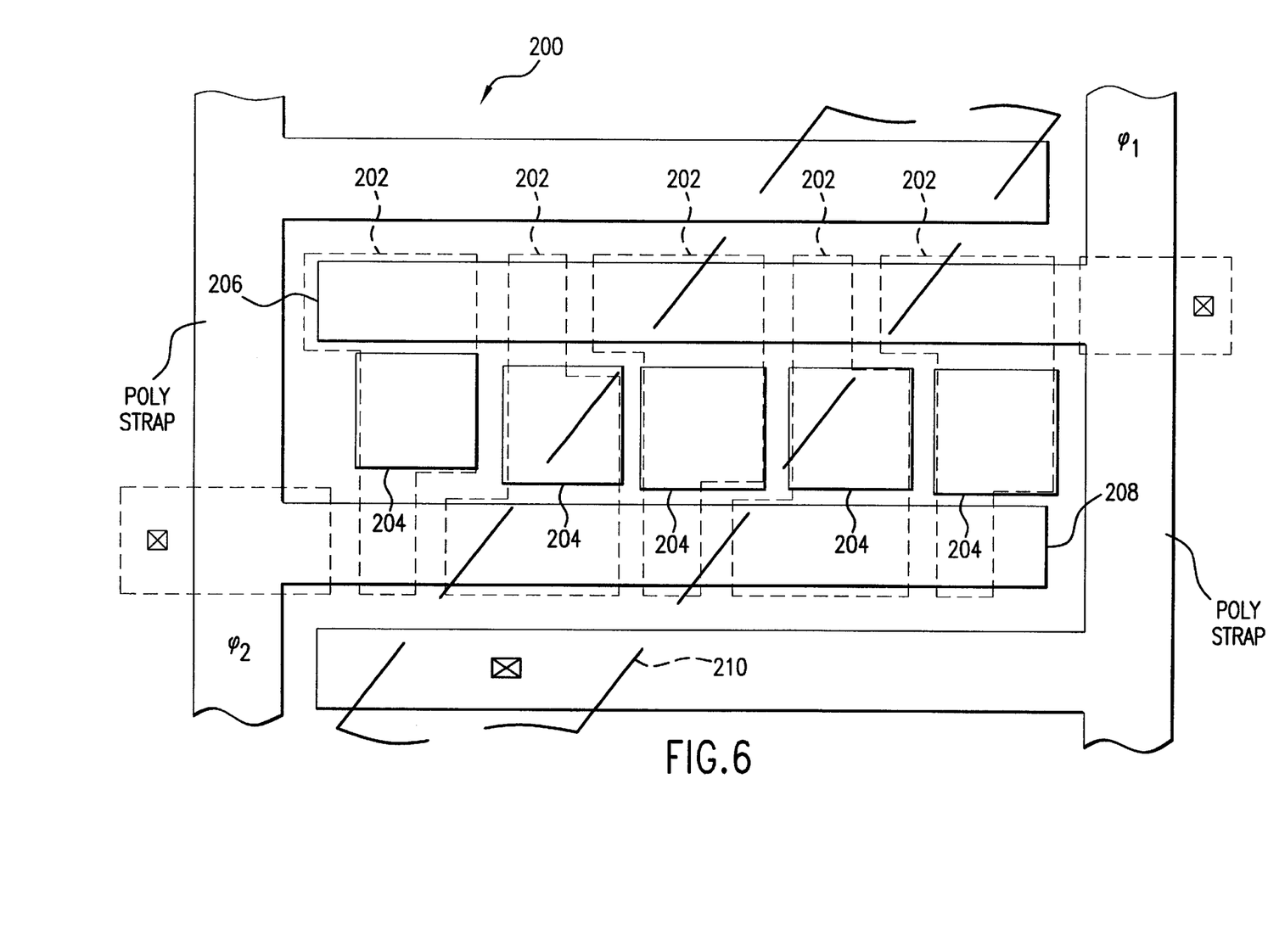
FIG. 6 is a plan view of a bucket brigade TDI sensor column showing a diagonal metal strap according to the present invention.

To achieve better speed performance, the present invention uses poly clock conductors instead of metal straps. The use poly straps, by itself, would not improve the speed of the sensor over that achievable by metal straps since it is still necessary to leave silicon area uncovered by poly to expose an underlying photodiode. However, in the present invention, diagonal metal straps 210 (FIG. 6) are used over the poly and over the imaging area to reduce clock line resistance. Since the present invention is a TDI sensor, the diagonal metal straps do not show up in the output of the sensor as long as the area shaded by the straps is controlled to be equal in each column. Moreover, a single poly layer covered by insulator and then a metalization layer is achievable in CMOS processes. In contrast, a second level of metal that would be needed by the Weimer sensor to diagonally strap the narrow clock conductors would have manufacturing difficulties when using standard CMOS processes.

Figure 5:
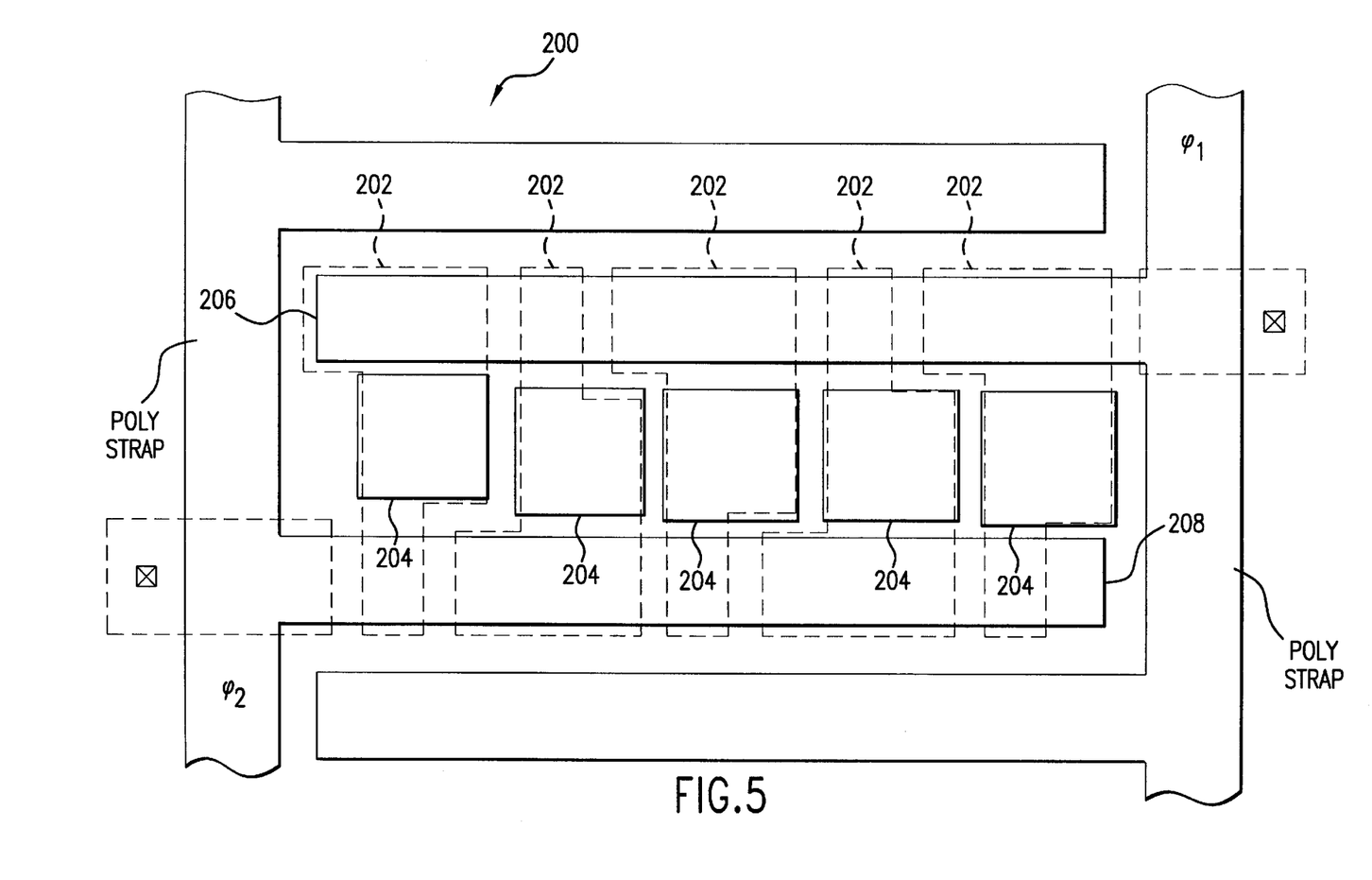
FIG. 5 is a plan view of a bucket brigade TDI sensor column according to the present invention.

The present invention uses pinned photodiodes instead of photodiodes used by Weimer. In FIG. 5, plan view 200 represents a portion of a bucket brigade TDI sensor with pinned photo diodes. A plurality of n type diffusion areas 202 in the form of asymmetric "Ts" are formed in a p type substrate by diffusion or ion implant to a first depth. Then, a plurality of p type "pinning areas" are formed, preferably by implant, over a central portion of respective areas 202 forming a vertical pnp structure pinned photodiode structure. The n type areas preferably have a heavier doping concentration (denoted n+) than would be customarily used for a normal PN photodiode. First phase clock strap 206 and second phase clock strap 208 are made of poly as discussed above, and are disposed apart to expose the area in which the pinned photodiodes were formed.

A wide diffusion area 202 (without pinning area 204) extends under one of the poly clock lines, and a narrow diffusion area 202 (without pinning area 204) extends under the other of the poly clock lines. Surface channel NMOS transistors are defined under the poly clock lines between adjacent diffusion areas 202. The insulation layer between the poly clock lines and the underlying semiconductor material is thinner than used in metal strapped bucket brigade structures, preferably sufficiently thin to permit surface channel NMOS transistors to conduct under an applied voltage of only 3 to 5 volts. Gaps between diffusion areas 202 that are not intended to be transistors are covered by a thicker insulation layer in much the same way as illustrated by FIG. 2; however, the overall thickness of the insulator in the present invention is thinner than that used in metal strapped circuits. In this way, a one direction propagation of charge in the bucket brigade structure is achieved. The wide diffusion area 202 (without pinning area 204) that extends under one of the poly clock lines forms a capacitance between the clock line and diffusion area, and the narrow diffusion area 202 (without pinning area 204) that extends under the other of the poly clock lines forms a lesser capacitance between the clock line and diffusion area than is form with the wide diffusion area. This aids in charge transfer from the narrow diffusion area to the wide diffusion area.

Weimer describes an ordinary PN photodiode as an n type diffusion area formed in a p type substrate. To make this into a pinned photodiode, a p type implant layer (in electrical communication with the substrate) would need to be formed on top of the diffusion area (making a pnp sandwich under Weimer's metal strap). This would disrupt the charge transfer of the bucket brigade structure taught by Weimer. Thus, pinned photodiodes are not compatible with the diffusion areas in the Weimer sensor without moving the PN photodiodes out from under Weimer's metal straps.

In the present invention, the pinned photodiode structure between the first and second clock lines can be emptied of charge faster than ordinary PN photodiodes. This helps reduce undesired image lag and improves the charge transfer efficiency (CTE). Using a thin pinning area over an underlying PN photodiode with an n+ cathode improves the production of photo-electrons in response to UV light when compared to ordinary PN photodiodes.

Modern TDI sensors typically have 96 to 100 pixels to integrate in a column, and at least 512 to 8,192 columns. Such a large format sensor (even with non-square pixels) could require an extreme aspect ratio (e.g., 85:1 with square pixels). Areas sensors to not have this extreme.

Having described preferred embodiments of a novel bucket brigade TDI sensor (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by letters patent is set forth in the appended claims.

What is claimed is:

1. A TDI sensor comprising:
    a bucket brigade column having a plurality of nodes; and
    a plurality of pinned photodiodes, each photodiode being formed integral with a corresponding node of the bucket brigade column.

2. The TDI sensor of claim 1, wherein:
    the sensor is formed in a substrate of a first conductivity type;
    a cathode of each pinned photodiode is formed of a second conductivity type integral with a corresponding node of the plurality of nodes; and
    each pinned photodiode includes a pinning layer of the first conductivity type.

3. The TDI sensor of claim 1, further comprising a bias charge voltage circuit, wherein:
    the bucket brigade column transfers charge in one direction; and
    the plurality of nodes includes an initial node coupled to the bias charge voltage circuit.

4. The TDI sensor of claim 1, wherein:
    the bucket brigade column includes a plurality of first phase clock conductors and a plurality of second phase clock conductors, the first and second phase clock conductors being interdigitated;
    the first and second phase clock conductors are formed out of a single poly-crystalline silicon layer.

5. The TDI sensor of claim 4, wherein the first and second phase clock conductors are formed by:
    depositing the single poly-crystalline layer over the bucket brigade column; and
    patterning the single poly-crystalline layer to define the first and second phase clock conductors.

6. The TDI sensor of claim 1, further comprising a substrate of a first conductivity type, wherein:
    the plurality of nodes are of a second conductivity type and are disposed in the substrate along a column direction; and
    each photodiode of the plurality of pinned photodiodes is of the second conductivity type and is disposed adjacent to and integral with a corresponding node of the plurality of nodes.

7. A TDI sensor comprising a bucket brigade column having a plurality of nodes and a plurality of pinned photodiodes, each photodiode being formed integral with a corresponding node of the bucket brigade column, wherein:
    the plurality of nodes define a plurality of inter-node channels between adjacent nodes;
    the plurality of inter-nodes channels include a plurality of first channels and a plurality of second channels;
    each channel of the plurality of first channels is disposed between adjacent channels of the plurality of second channels;
    the bucket brigade column includes a plurality of first phase clock conductors and a plurality of second phase clock conductors;
    each clock conductor of the plurality of first phase clock conductors is spacedly disposed over a corresponding channel of the plurality of first channels; and
    each clock conductor of the plurality of second phase clock conductors is spacedly disposed over a corresponding channel of the plurality of second channels.

8. A TDI sensor comprising:
    a bucket brigade column having a plurality of nodes, a plurality of first phase clock conductors and a plurality of second phase clock conductors, the first and second phase clock conductors being interdigitated and formed of poly-crystalline silicon; and
    a plurality of photodiodes, each photodiode being formed integral with a corresponding node of the bucket brigade column.

9. The TDI sensor of claim 8, wherein the first and second phase clock conductors are formed out of a single poly-crystalline silicon layer.

10. The TDI sensor of claim 8, further comprising a bias charge voltage generator, wherein:

the bucket brigade column transfers charge in one direction; and the plurality of nodes includes an initial node coupled to the bias charge voltage generator.

11. A TDI sensor comprising:

a bias charge voltage circuit;

a reset voltage circuit;

a bucket brigade column having a plurality of nodes, the bucket brigade column being coupled between the bias charge voltage circuit at an initial node and the reset voltage circuit at a final node; and a plurality of photodiodes, each photodiode being formed integral with a corresponding node of the bucket brigade column.

12. The TDI sensor of claim 11, wherein the bucket brigade column includes:

a plurality of first phase clock conductors; and a plurality of second phase clock conductors, the first and second phase clock conductors being interdigitated and formed of poly-crystalline silicon.

13. The TDI sensor of claim 11, wherein:

the photodiodes are pinned photodiodes;

the sensor is formed in a substrate of a first conductivity type;

a cathode of each pinned photodiode is formed of a second conductivity type integral with a corresponding node of the plurality of nodes; and each pinned photodiode includes a pinning layer of the first conductivity type.

14. The TDI sensor of claim 13, wherein the bucket brigade column includes:

a plurality of first phase clock conductors; and a plurality of second phase clock conductors, the first and second phase clock conductors being interdigitated and formed of poly-crystalline silicon.

15. The TDI sensor of claim 4, further comprising a diagonal metal strap insulatively spaced over the first and second clock phase conductors.

16. The TDI sensor of claim 8, further comprising a diagonal metal strap insulatively spaced over the first and second clock phase conductors.

17. The TDI sensor of claim 12, further comprising a diagonal metal strap insulatively spaced over the first and second clock phase conductors.

18. The TDI sensor of claim 14, further comprising a diagonal metal strap insulatively spaced over the first and second clock phase conductors.

19. The TDI sensor of claim 1, wherein:

the bucket brigade column includes a first phase clock conductor and a second phase clock conductor;

the first and second phase clock conductors are interdigitated; and the first and second phase clock conductors are formed out of a single poly-crystalline silicon layer.

20. The TDI sensor of claim 11, wherein the bucket brigade column includes:

a first phase clock conductor;

a second phase clock conductor, the first and second phase clock conductors being interdigitated and formed out of poly-crystalline silicon.

21. The TDI sensor of claim 13, wherein the bucket brigade column includes:

a first phase clock conductor;

a second phase clock conductor, the first and second phase clock conductors being interdigitated and formed out of poly-crystalline silicon.

22. A TDI sensor comprising:

a bucket brigade column having a plurality of nodes, a first phase clock conductor and a second phase clock conductor, the first and second phase clock conductors being interdigitated and formed of poly-crystalline silicon; and a plurality of photodiodes, each photodiode being formed integral with a corresponding node of the bucket brigade column.

23. A TDI sensor having a bucket brigade column formed in a substrate of a first conductivity type, the bucket brigade column including:

a plurality of regions formed in the substrate of a second conductivity type so as to define a column direction;

a first clock conductor disposed co-parallel with the column direction and insulatively spaced over a first portion of each region of the plurality of regions;

a second clock conductor disposed co-parallel with the column direction and insulatively spaced over a second portion of each region of the plurality of regions, the first and second clock conductors being spaced apart to expose a photodiode formed between a third portion of each region of the plurality of regions and the substrate.

24. The TDI sensor of claim 23, wherein:

the bucket brigade column further includes a plurality of pinning regions of the first conductivity type; and each pinning region is formed in a shallow layer over the corresponding third portion of each region of the plurality of regions.

* * * * *